United States Patent
Stark

(10) Patent No.: US 6,822,213 B2
(45) Date of Patent: Nov. 23, 2004

(54) IMAGE SENSORS WITH IMPROVED SIGNAL TO NOISE RATIO

(75) Inventor: Moshe Stark, Even Yehuda (IL)

(73) Assignee: Vision - Sciences Inc, Orangeburg, NY (US)

(*) Notice: Subject to any disclaimer, the term of this patent is extended or adjusted under 35 U.S.C. 154(b) by 0 days.

(21) Appl. No.: 10/440,331

(22) Filed: May 19, 2003

(65) Prior Publication Data

US 2003/0201379 A1 Oct. 30, 2003

Related U.S. Application Data

(63) Continuation of application No. 09/993,886, filed on Nov. 27, 2001, now abandoned.
(60) Provisional application No. 60/252,915, filed on Nov. 27, 2000.

(51) Int. Cl.[7] ............................. H01L 27/00; H04N 3/14
(52) U.S. Cl. .................... 250/208.1; 348/294; 348/300; 250/214 A
(58) Field of Search ........................... 250/208.1, 208.6, 250/214 A; 348/294, 297, 300, 308, 310, 313, 314; 257/443

(56) References Cited

U.S. PATENT DOCUMENTS

| | | |
|---|---|---|
| 3,911,467 A | 10/1975 | Levine et al. |
| 4,471,228 A | 9/1984 | Nishizawa et al. |
| 4,472,638 A | 9/1984 | Nishizawa et al. |
| 4,583,002 A | 4/1986 | Kondo et al. |
| 4,635,126 A | 1/1987 | Kinoshita |
| 4,706,123 A | 11/1987 | Chautemps |
| 4,758,734 A | 7/1988 | Uchida et al. |
| 4,761,689 A | 8/1988 | Takatsu et al. |
| 4,839,735 A | 6/1989 | Kyomasu et al. |
| 4,935,636 A * | 6/1990 | Gural ...................... 250/578.1 |
| 4,942,473 A | 7/1990 | Zeevi et al. |
| 4,984,002 A | 1/1991 | Kokubo |
| 5,049,752 A | 9/1991 | Kalaf et al. |
| 5,060,245 A | 10/1991 | Nelson |
| 5,227,313 A | 7/1993 | Gluck et al. |
| 5,262,871 A | 11/1993 | Wilder et al. |
| 5,264,944 A | 11/1993 | Takemura |
| 5,278,660 A | 1/1994 | Sugiki |
| 5,291,294 A | 3/1994 | Hirota |
| 5,351,309 A | 9/1994 | Lee et al. |
| 5,354,980 A * | 10/1994 | Rappoport et al. ...... 250/208.1 |
| 5,369,047 A | 11/1994 | Hynececk |
| 5,396,091 A | 3/1995 | Kobayashi et al. |

(List continued on next page.)

OTHER PUBLICATIONS

U.S. patent application Ser. No. 09/426,452, filed Oct. 25, 1999, Stark.

(List continued on next page.)

*Primary Examiner*—Stephone B. Allen
(74) *Attorney, Agent, or Firm*—Eitan, Pearl, Latzer & Cohen Zedek, LLP

(57) ABSTRACT

An image sensor array including a first plurality of unit cells coupled to a first sense amplifier, and a second plurality of unit cells coupled to a second sense amplifier, where the first plurality and the second plurality are substantially electrically isolated from each other.

24 Claims, 5 Drawing Sheets

U.S. PATENT DOCUMENTS

| | | | |
|---|---|---|---|
| 5,452,004 A | 9/1995 | Roberts | |
| 5,463,421 A | 10/1995 | Deguchi et al. | |
| 5,471,515 A | 11/1995 | Fossum et al. | |
| 5,481,301 A | 1/1996 | Cazaux et al. | |
| 5,485,004 A | 1/1996 | Suzuki et al. | |
| 5,521,366 A | 5/1996 | Wang et al. | |
| 5,539,461 A | 7/1996 | Andoh et al. | |
| 5,541,402 A | 7/1996 | Ackland et al. | |
| 5,541,654 A | 7/1996 | Roberts | |
| 5,546,127 A | 8/1996 | Yamashita et al. | |
| 5,563,405 A * | 10/1996 | Woolaway et al. | 250/208.1 |
| 5,576,762 A | 11/1996 | Udagawa | |
| 5,576,763 A | 11/1996 | Ackland et al. | |
| 5,638,120 A | 6/1997 | Mochizuki | |
| 5,638,123 A | 6/1997 | Yamaguchi | |
| 5,650,352 A | 7/1997 | Kamasz et al. | |
| 5,666,567 A | 9/1997 | Kusaka | |
| 5,694,495 A | 12/1997 | Hara et al. | |
| 5,712,682 A | 1/1998 | Hannah | |
| 5,721,425 A | 2/1998 | Merril | |
| 5,739,562 A | 4/1998 | Ackland et al. | |
| 5,742,659 A | 4/1998 | Atac et al. | |
| 5,812,191 A | 9/1998 | Orava et al. | |
| 5,835,141 A | 11/1998 | Ackland et al. | |
| 5,841,126 A | 11/1998 | Fossum et al. | |
| 5,841,159 A | 11/1998 | Lee et al. | |
| 5,854,498 A | 12/1998 | Merrill | |
| 5,856,667 A | 1/1999 | Spirig et al. | |
| 5,867,215 A | 2/1999 | Kaplan | |
| 5,877,808 A | 3/1999 | Iizuka | |
| 5,881,159 A | 3/1999 | Aceti et al. | |
| 5,887,204 A | 3/1999 | Iwasaki | |
| 5,892,541 A | 4/1999 | Merrill | |
| 5,896,172 A | 4/1999 | Korthout et al. | |
| 5,949,483 A | 9/1999 | Fossum et al. | |
| 5,969,759 A | 10/1999 | Morimoto | |
| 6,078,037 A | 6/2000 | Booth, Jr. | |
| 6,091,449 A | 7/2000 | Matsunaga et al. | |
| 6,115,065 A | 9/2000 | Yadid-Pecht et al. | |
| 6,122,008 A | 9/2000 | Komobuchi et al. | |
| 6,137,533 A | 10/2000 | Azim | |
| 6,141,049 A | 10/2000 | Harada | |
| 6,166,367 A | 12/2000 | Cho | |
| 6,252,217 B1 * | 6/2001 | Pyyhtia et al. | 250/208.1 |
| 6,300,977 B1 | 10/2001 | Waechter et al. | |
| 6,452,633 B1 | 9/2002 | Merrill et al. | |
| 6,529,241 B1 | 3/2003 | Clark | |
| 6,606,121 B1 | 8/2003 | Bohm et al. | |

OTHER PUBLICATIONS

U.S. patent application Ser. No. 09/516,168, filed Feb. 29, 2000, Stark.

U.S. patent application Ser. No. 09/629,703, filed July 31, 2000, Stark.

U.S. patent application Ser. No. 09/993,917, filed Nov. 27, 2001, Stark.

U.S. patent application Ser. No. 10/332,151, filed Jan. 6, 2003, Stark.

Roger Paniacci et al., "Programmable multiresolution CMOS active pixel sensor", 72/SPIE, vol. 2654, 1996, pp. 72–79.

Zhimin Zhou et al., "Frame Transfer CMOS Active Pixel Sensor with Pixel Binning", IEEE Transactions on Electron Devices, vol. 44, No. 10, Oct. 1997, pp. 1764–1768.

Lisa G. McIlarth et al., "Design and Analysis of 512×768 Current–Mediated Active Pixel Array Image Sensor", IEEE-Transactions on Electron Devices, vol. 44, No. 10, Oct. 1997, pp. 1706–1715.

R. Daniel McGrath et al., "Current Mediated, Current–Reset 768×512 Active Pixel Sensory Array", ISC97/Session 11/Imaging Circuits and Systems/Paper FA 11.2, p. 182–183.

Chih–Cheng Hseih et al., "A new Cryogenic CMOS Readout Structure for Infrared Focal Plane Array", IEEE Journal of Solid–State Circuits, vol. 32, No. 8, Aug. 1997, pp. 1192–1199.

Nanyoung Yoon et al., "A New Unit Cell of Current Mirroring Direct Injection Circuit for Focal Plane Arrays", SPIE, vol. 3061, pp. 93–101.

J. R. Willison, "Signal Detection and Analysis", Handbook of optics, vol. 1, Part 6, Chapter 18, McGraw Hill, 1995.

T. J. Tredwell, "Visible Array Detectors", Handbook of Optics, vol. 1, Part 6, Chapter 22, McGraw Hill, 1995.

L. J. Kozlowsky and W. F. Kosonocky, "Infrared Detector Arrays", Handbook of Optics, vol. 1, Part 6, Chapter 2, McGraw Hill, 1995.

Eric R. Fossum and Bedabrata Pain, "Infrared Readout Electronics for Space Science Sensors: State of the Art and Future Directions", SPIE, vol. 2020, Infrared Technology XIX (1993), pp. 262–285.

Orly Yadid Pecht et al.: "Optimization of Noise and Responsivity in CMOS Active Sensors for Detection of Ultra Low Light Levels", SPIE vol. 3019, 0277–786X/97, pp. 125–136.

Eric R. Fossum—"Ultra Low Power Imagingj Systems Using CMOS ImageSensor Technology", SPIE vol. 2267, 0–8194–1591–X/94, pp. 107–111.

Eric R. Fossum: "Active Pixel Sensors: Are CCD's Dinosaurs?", SPIE vol. 1990, 0–8194–1133–7/93, pp. 2–14.

Wolfgang Wittenstein et al: "Simulation Study on Fixed Pattern Noise and MRTD", SPIE vol. 2252. 0–8194–1911–7/95, pp. 489–601.

E. Mottin et al.: "An Improved Architecture of IRFPA Readout Circuits", SPIE vol. 3061, 0277–786/97, pp. 117–126.

B. Pain et al.: "Low–Power, Low–Noise Analog Circuits for on Focal–Plane Signal Processing of Infrared Sensors", In infrared Detectors and Instrumentation, Pro. SPIE, vol. 1946, pp. 365–374, 1993.

Steven Decker et al.: "A 256×256 CMOS Imaging Array with Wide Dynamic Range Pixels and a Column–Parallel Digital Output", IEEE Journal of Solid–State Circuits, vol. 33, No. 12, Dec. 1998, pp. 2081–2091.

Chih–Cheng et al.: "A new CMOS Readout Circuit Design for IRFPA with Adaptive Gain Control and Current–Mode Background Suppression", 0703–3073–0/96, 1996 IEEE, pp. 137–140.

Hon–Sum Wong: "Technology and Device Scalling Considerations for CMOS Imagers", IEEE Transactions on Electron Devices, vol. 43, No. 12, Dec. 1996, pp. 2131–2142.

Hon–Sum Wong et al.: "CMOS Active Pixel Image Sensors Fabricated Using a 1.8V, 0.25 gm CMOS Technology", 0–7803–3393–4, 1996 IEEE, IEDM 96–915, pp. 35.5.1–35.5.4.

Orly Yadid–Pecht et al. "Wide Intrascene Dynamic Range CMOS APS Using Dual Sampling, " IEEE Trans. On Electron Devices, vol. 44, No. 10, Oct. 1997, pp. 1721–1723.

Orly Yadid–Pecht et al., "CMOS Active Pixel Sensor Star Tracker with Regional Electronic Shutter," *IEEE Journal of Solid State Circuits*, vol. 32, No. 2, Feb. 1997, pp. 285–288.

Orly Yadid–Pecht et al., "Wide Dynamic Range APS Star Tracker," *SPIE*, vol. 2654, 1996, pp. 82–92.

Christopher Clark et al., "Application of APS Arrays to Star and Feature Tracking Systems," *SPIE*, vol. 2810, 1996, pp. 116–120.

Orly Yadid–Pecht et al., "A Random Access Photodiode Array for intelligent Image Capture," *IEEE Transactions on Electron Devices*, vol. 28, No. 8, Aug. 1991, pp. 1772–1780.

Sarit Chen et al., "Adaptive Sensitivity CCD Image Sensor," *SPIE*, vol. 2415, 1995, pp. 303–309.

G.P. Weckler, "Operation of p–n junction photodetectors in photon flux integration mode," *IEEE JSSC*, vol. SC–2, No. 3, Sept. 1967.

R. Dyck and G. Weckler, "Integrated arrays of silicon photodetectors for image sensing," *IEEE Trans. Electron Devices*, vol ED–15, No. 4, Apr. 1968, 196–201.

J.I. Nakamura et al., "CMOS active pixel image sensor with simple floatng gate pixels," *IEEE Trans. Electron Devices,*. vol. 42, No. 9, Sept, 1995, pp. 1693–1694.

E–S Eid et al., "A 256×256 CMOS active pixel image sensor," *SPIE*, vol. 2415, Sept. 1995.

H. Yamashita et al., "A 2/3–in 2 million pixel STACK–CCD HDTV Imager," *IEEE JSSC*, vol. 30, No. 8, Aug. 1995, pp. 881–889.

R.H. Nixon et al., "256 ×256 CMOS active pixel sensor camera–on–a–chip," *IEEE JSSC*, vol. 31, No. 12, Dec. 1996.

B. Dierickx et al., "Random addressable active pixel image sensors," *SPIE*, vol. 2950, Aug. 1996, pp. 2–7.

D. Scheffer et al., "Random addressable 2048 ×2048 active pixel sensor," *IEEE Trans. Elec. Devices*, vol. 44, No. 10, Oct. 1997, pp. 1716–1720.

T. Nomoto et al., "A 4M–pixel CMD image sensor with block and skip access capablitiy," *IEEE Trans. Electron. Devices*, vol. 44, No. 10, Oct. 1997, 1738–1746.

Y. Iida et al., "A ¼–inch 330k square pixel progressive scan CMOS active image sensor," *IEEE JSSC*, vol. 32, No. 11, Nov. 1997, pp. 2042–2047.

S. Ohsawa et al., "Analysis of low fixed pattern noise cell structures for photconversion layer overlaid CCD or CMOS image sensors," *IEEE Trans. electron. Devices*, vol. 44, No. 10, Oct. 1997.

S. Kemeny et al., "CMOS active pixel sensor array with programmable multiresolution readout," *JPL*, California Institute of Technology, 1994.

Chamberlain S.G. and Lee J.P., "A Novel Wide Dynamic Range Silicon Photodetector and Linear Imaging Array", IEEE Transactions on Electron Device, vol. Ed. 31, No. 2, Feb. 1984, pp. 175–182.

Delbruck T. and C. Mead, "Analog VLSI Phototransduction by Continuous–Time, Adaptive, Logarithmic Phtoreceptor Circuits", Tech. Rep. California Institute of Technology, Pasadena California 91125, 1994. URL:http:/www.pcmp.caltech.edu/anaprose/tobi.recep/.

Fossum et al., "Application of the Active Pixel Sensor Concept to Guidance and Navigation", SPIE, vol. 1949, paper 30, 1993.

* cited by examiner

IMAGE SENSORS WITH IMPROVED SIGNAL TO NOISE RATIO

CROSS-REFERENCE TO RELATED APPLICATIONS

This application is a continuation of U.S. patent application Ser. No. 09/993,886, filed on Nov. 27, 2001, now abandoned entitled "Noise floor reduction in image sensors", incorporated herein by reference in its entirety, which claims the benefit of U.S. Provisional Patent Application Ser. No. 60/252,915, filed Nov. 27, 2000, and entitled "Noise floor reduction in image sensors".

FIELD OF THE INVENTION

The present invention relates to imaging electronics in general, and more particularly to noise floor reduction in CMOS process Active Pixel image sensor systems.

BACKGROUND OF THE INVENTION

CMOS process Active Pixel Sensor (APS) technology is foreseen as the next generation technology for image sensors, which will replace the currently dominating CCD technology. Among the advantages that APS technology has over CCD technology are the ability to integrate image sensor and camera electronics onto a single chip, low power dissipation due to the inherently lower CMOS process voltage as compared with CCD voltage, and significantly-lower manufacturing costs.

Dramatic advance in the CMOS process technology are also expected to lead to the implementation of imagers with a 5 $\mu$m pixel pitch on a submicron CMOS process, which is approximately equal to the diffraction limit of the camera lens. This limit offsets one of the major advantages of CCD technology, namely the high fill factor afforded by a very simple pixel circuit.

The ability to implement photographic-quality imagers using CCD technology is severely limited by the large array dimensions that would be required, having thousands of pixel columns and rows. It is difficult to implement such large arrays using CCD technology due to the CCD Charge Transfer Efficiency (CTE) factor which dictates that image quality severely deteriorates as the size of the image sensor array increases. It is not commercially feasible to produce 3,000×2,000 pixel CCD arrays as would be required for near photographic quality images due to the prohibitive manufacturing costs involved.

Although the transition from CCD-based technology to APS-based technology for commercial image sensors appears inevitable, APS technology has several limitations that have yet to be overcome. The ability to implement large CMOS-based APS image sensor arrays is limited by readout bus capacitance that originates from multiplexing all pixels within each column into a single column line. The parasitic output capacitances of the multiplexing circuits and of the line interconnect, normally implemented with metal, are the major contributors to column capacitance. Thus, for a given CMOS process and pixel unit cell size, the column capacitance is proportional to the number of multiplexed rows.

The column capacitance is the dominant contributor to the input-referred noise, and it governed by the so-called "kTC" noise mechanism. One technique that may be used to reduce the kTC noise effect involves introducing an amplification stage in each pixel's unit cell by including an in-pixel Source-Follower circuit. The Source-Follower amplifier "de-couples" the in-pixel integration capacitor from the column capacitance, which results in a reduced input-referred readout noise. However, this technique leads to a reduction in gain due to the attenuation of the signal as a function of column bus capacitance. This can be costly in terms of signal-to-noise ratio (SNR) for large-format circuits with a high column capacitance and for applications where the charge that is involved is small. Thus, although implementing a Source-Follower circuit results in a reduced input-referred readout noise, its effect diminishes as the imager's size increases due to the increasing column capacitance.

SUMMARY OF THE INVENTION

The present invention seeks to provide methods and apparatus for noise floor reduction in CMOS-based APS image sensor arrays that overcomes disadvantages of the prior art. The present invention substantially reduces the column capacitance in large image sensor arrays, resulting in a reduced noise floor and a better signal-to-noise ratio. A Direct Injection (DI) circuit approach is employed in place of the Source-Follower circuit per unit cell approach. A DI circuit is relatively simple to implement and deploys less transistors per unit cell, which results in a higher unit cell fill-factor, a smaller pixel, or both. Furthermore, the Fixed Pattern Noise (FPN) of a DI circuit is considerably lower than that of the Source-Follower-based unit cell. The DI circuit of the present invention directly injects the charge accumulated by the integration capacitor into the column. This results in a significant input-referred readout noise that is higher than that of the Source-Follower-based unit cell. By reducing column capacitance the present invention significantly reduces the image sensor's noise floor and improves its signal-to-noise ratio, particularly in large image sensor arrays.

In one aspect of the present invention an image sensor array is provided including a first plurality of unit cells coupled to a first sense amplifier, and a second plurality of unit cells coupled to a second sense amplifier, where the first plurality and the second plurality are substantially electrically isolated from each other.

In another aspect of the present invention each of the first and second pluralities of unit cells includes at least one column line.

In another aspect of the present invention the unit cells are arranged in two or more clusters of two or more of the unit cells each, and the unit cells within each of the clusters are coupled to a cluster line which is coupled to the column line.

In another aspect of the present invention only one of the clusters is actively connected to the column line at any given time.

In another aspect of the present invention the unit cells are direct injection unit cells.

In another aspect of the present invention the first plurality and the second plurality are substantially electrically isolated from each other by at least 10M Ohms.

In another aspect of the present invention an image sensor array is provided including a plurality of columns, each column including a plurality of unit cells coupled to a column line, a first sense amplifier coupled to a first plurality of the unit cells in each of the columns, and a second sense amplifier coupled to a second plurality of the unit cells in each of the columns, where the first and second pluralities of the unit cells in each of the columns are substantially electrically isolated from each other.

In another aspect of the present invention each of the columns includes a plurality of clusters, each cluster including two or more of the unit cells coupled to a cluster line which is coupled to the column line.

In another aspect of the present invention only one of the clusters is actively connected to the column line at any given time.

In another aspect of the present invention the unit cells are direct injection unit cells.

In another aspect of the present invention the first plurality and the second plurality are substantially electrically isolated from each other by at least 10M Ohms.

In another aspect of the present invention a method for reducing noise floor in an image sensor is provided, the method including sensing a first plurality of unit cells with a first sense amplifier; and sensing a second plurality of unit cells with a second sense amplifier.

In another aspect of the present invention either of the sensing steps includes sensing different subsets of the unit cells at different times.

In another aspect of the present invention either of the sensing steps includes sensing mutually exclusive subsets of the unit cells at different times.

In another aspect of the present invention each of the sensing steps includes sensing its associated plurality of unit cells in substantial electrical isolation from the other the plurality of unit cells.

In another aspect of the present invention each of the sensing steps are performed alternatingly.

The disclosures of all patents, patent applications, and other publications mentioned in this specification and of the patents, patent applications, and other publications cited therein are hereby incorporated by reference in their entirety.

BRIEF DESCRIPTION OF THE DRAWINGS

The present invention will be understood and appreciated more fully from the following detailed description taken in conjunction with the appended drawings in which.

DETAILED DESCRIPTION OF PREFERRED EMBODIMENTS

Figure 1A:
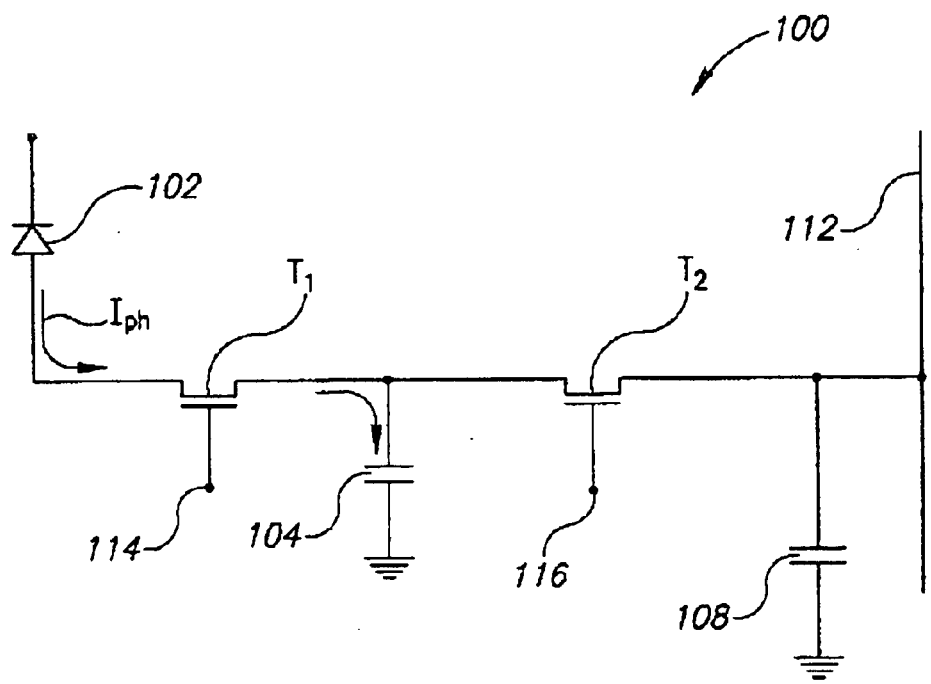
FIGS. 1A and 1B are schematic flow illustrations of a Direct Injection (DI) unit cell 100, useful in understanding the present invention.
Figure 1B:
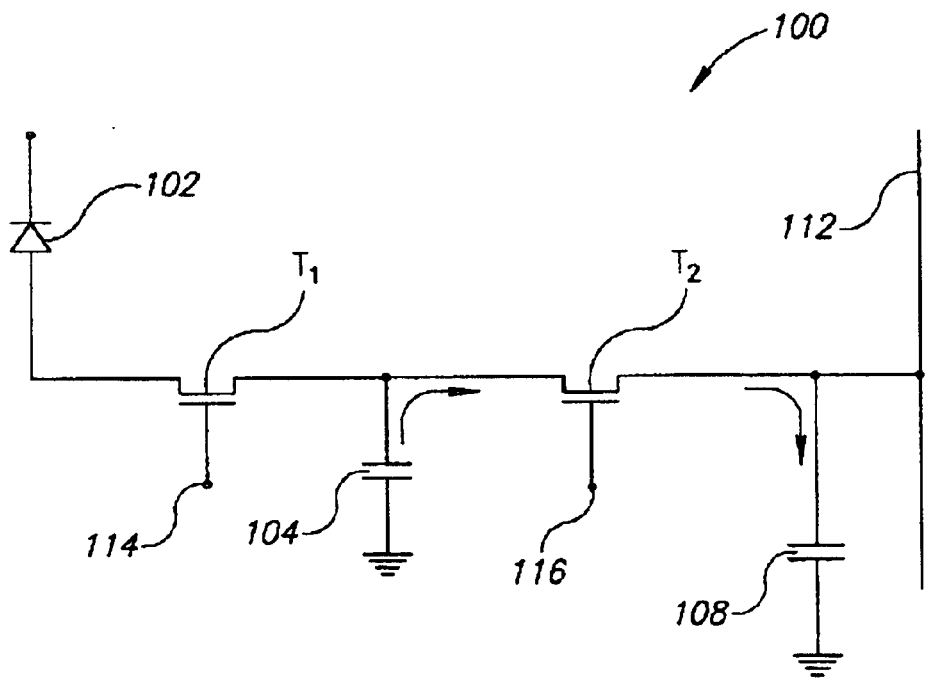

Reference is now made to FIGS. 1A and 1B, which are schematic illustrations of a Direct injection (DI) unit cell 100, useful in understanding the present invention. Direct Injection unit cell 100 is shown as having a photodiode (PD) 102, an integration capacitor ($C_{int}$) 104, a transistor $T_1$, column line capacitance ($C_{col}$) 108, a readout transistor $T_2$, a column line 112, and transistor gates 114 and 116.

When an image sensor's background photon noise is low, its noise floor is determined by the image sensor's electronics, particularly the readout electronics associated with photocurrent signals, as well as its input stages, which in turn determines the image sensor's sensitivity.

The major noise components which determine the noise floor are Fixed Pattern Noise (FPN), 1/f noise, and white noise. A Direct Injection stage typically features a very low FPN, and conventional techniques may be applied to remove 1/f noise. If generated at later stages, white noise may also be removed using conventional techniques.

Among the major factors which set the lower bound to noise originating from the pixel readout, the dominant noise component is the so-called kTC noise, which originates from transferring charges from their origin to a collecting capacitor C. The kTC noise originates from a resistor which charges a capacitor. The noise output on the capacitor, $<v_n>$, which originates from a resistor, is expressed:

$$\langle v_n \rangle = \sqrt{\frac{kT}{C}} \quad \text{(EQ. 1)}$$

where k is Boltzmann's constant of $1.38 \times 10^{-23}$ Joul/° K., T is the resistor's/capacitor's temperature expressed in degrees Kelvin, C is the capacitor's capacitance expressed in Farads, and $<v_n>$ is the capacitor's RMS noise voltage expressed in Volts.

The noise may be expressed in terms of "noise electrons," that is the number of electrons that would cause the RMS noise on capacitor C. The RMS number of noise electrons, $<N_n>$ may be derived from (EQ. 1) as:

$$\langle N_n \rangle = \frac{1}{e} \cdot \sqrt{kTC} \quad \text{(EQ. 2)}$$

where e is the electron charge of $1.6 \times 10^{-19}$ Coulomb.

In FIG. 1A a photon-generated photocurrent $I_{ph}$ flows from photodiode PD 102 into integration capacitor $C_{int}$ 104 through transistor $T_1$. The kTC noise source is the transistor $T_1$ channel resistance. The photocurrent integration stage is depicted in FIG. 1A, and thus the noise source may be defined as the integration noise. The integration noise may be expressed in terms of RMS voltage as:

$$\langle v_n^{int} \rangle = \sqrt{\frac{kT}{C_{int}}} \quad \text{(EQ. 3)}$$

where $<v_n^{int}>$ is the RMS integration noise and $C_{int}$ is the charge integration capacitance. The RMS number of noise electrons $<N_n^{int}>$ may be expressed as:

$$\langle N_n^{int} \rangle = \frac{1}{e} \cdot \sqrt{kTC_{int}} \quad \text{(EQ. 4)}$$

FIG. 1B shows the path taken by the integrated charge readout from the integration capacitor ($C_{int}$) 104 to the column line 112. The column line's capacitance is shown as $C_{col}$ 108. The charge transfer is embodied as a current flow through a readout transistor $T_2$. This current flow generates a kTC noise on the column line, and the noise component is translated into an equivalent noise source on the integration capacitor ($C_{int}$) 104. This represents the noise on the integration capacitor that would result in the same noise on the column line. This noise is referred to as "input-referred noise," and is expressed as $<v_n^{col}>$ for the RMS noise voltage and $<N_n^{col}>$ for the RMS number of noise electrons. It may be shown that, $$\langle v_n^{col} \rangle = \sqrt{\frac{kT}{C_{int}}} \cdot \left( \sqrt{\frac{C_{col}}{C_{int}}} + \sqrt{\frac{C_{int}}{C_{col}}} \right) \quad \text{(EQ. 5)}$$

and $$\langle N_n^{col} \rangle = \frac{1}{e} \cdot \sqrt{kTC_{int}} \cdot \left( \sqrt{\frac{C_{col}}{C_{int}}} + \sqrt{\frac{C_{int}}{C_{col}}} \right) \quad \text{(EQ. 6)}$$

Typically, $C_{col} \gg C_{int}$. Thus, it may be seen that the dominant factor which contributes to noise floor is not the integration noise, but rather the noise that originates from the integrated charge readout to the image sensor's column.

By way of example, given a 0.6 $\mu$m process, a 10 $\mu$m×10 $\mu$m pixel, and a 1,000-row image sensor, the column capacitance is approximately 4 pF, and the integration capacitance is approximately 0.1 pF. In this example, the column input-referred readout noise is approximately 6.5 times greater than the integration noise. The readout noise is approximately 40 $\mu$V RMS, while the input-referred readout noise is approximately 1.5 mV. The integration noise is approximately 6 $\mu$V rms.

Thus, it may be seen that the column readout noise is the dominant factor and may be considered to be the noise floor. Significant reduction of the column readout capacitance would therefore result in a significant noise floor reduction, as the column readout noise is determined by the $$\frac{C_{col}}{C_{int}}$$

ratio and reduction of $C_{col}$ would result in noise floor reduction.

Improvement in the signal-to-noise ratio may also be achieved as follows. Let $v_{int}$ represent the highest possible signal that may be collected on the integration capacitor $C_{int}$ at reaching saturation. Given that column readout noise is a dominant contributor to noise floor, the signal-to-noise ratio may be approximated as:

$$SNR \cong \frac{v_{int}}{\langle v_n^{col} \rangle} \quad \text{(EQ. 7)}$$

where SNR is the signal-to-noise ratio at the column line, $v_{int}$ is the near-saturation voltage on the integration capacitance, and $<v_n^{col}>$ is the input-referred column line noise RMS voltage. Thus, for a 5 volt process $v_{int}$ is approximately 1.5 Volts. Continuing with the previous example, given a 373° K. junction temperature, the input-referred column readout noise may be as much as ~1.5 mVolts, resulting in a signal-to-noise ratio of approximately 1,000. Where column readout noise is negligible, the signal-to-noise ratio is limited mainly by the charge integration noise, being approximately 6.5 times better than the signal-to-noise ratio in this example.

Figure 2:
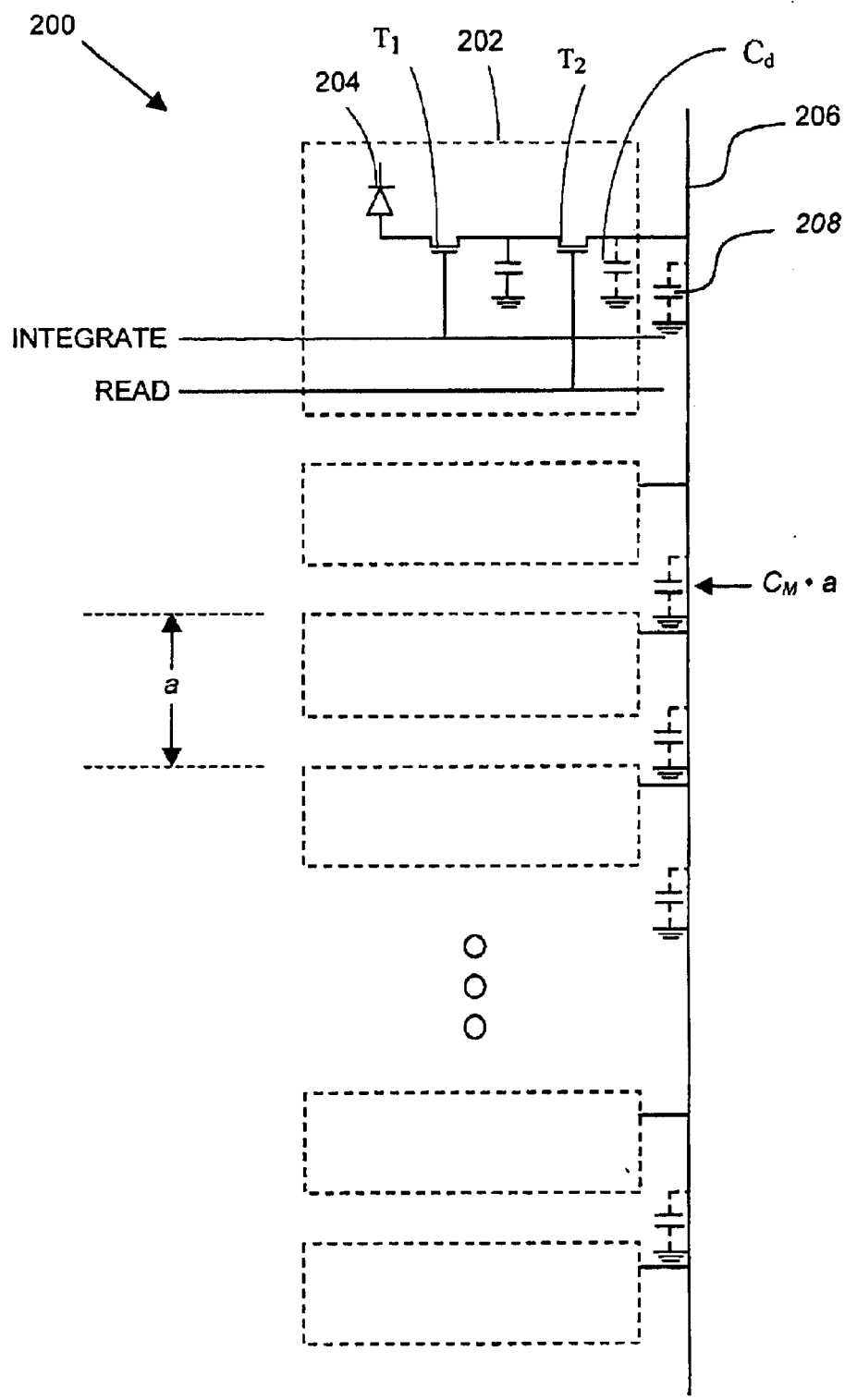
FIG. 2 is a schematic illustration of an image sensor array segment, useful in understanding the present invention.

Reference is now made to FIG. 2, which is a schematic flow illustration of an image sensor array segment, useful in understanding the present invention. In FIG. 2 a single column 200 of an X by V-rows image sensor array is shown having multiple unit cells 202 connected to a column line 206, where each unit cell includes a Direct Injection (DI) circuit 204 as described hereinabove with reference to FIGS. 1A and 1B. In the configuration shown, when a row is read out, its readout transistors $T_2$ conduct a charge, and the charge accumulated on the integration capacitors of the row is transferred to its respective column line. All the other readout transistors which reside on each column are in a cutoff state.

The column capacitance $C_{col}$ in FIG. 2 may be approximated by:

$$C_{col} \cong V \cdot (C_d + c_M \cdot a) \quad \text{(EQ. 8)}$$

where V is the number of image sensor rows, $C_d$ is the readout transistor drain capacitance when in cutoff and when the column is biased approximately to 0 Volts, $c_M$ is the column metal capacitance per unit length, and a is the pixel pitch for square pixels. $c_{col} \cong C_d + c_M \cdot a$ is thus the column capacitance per pixel, as is shown at reference numeral 208.

It may thus be seen that column capacitance, which determines the noise floor, is directly proportional to the number of rows in the image sensor, and, thus, the larger the image sensor array, the greater the noise floor.

Figure 3A:
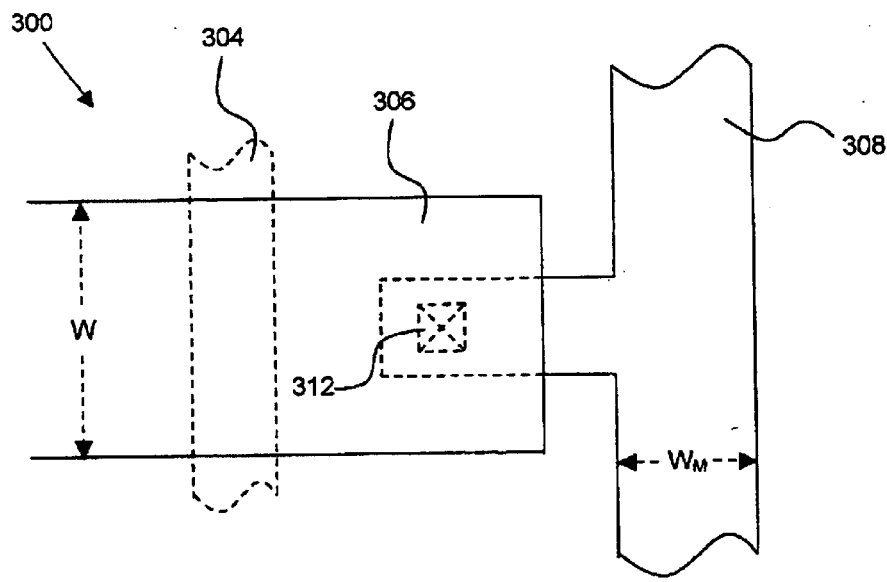
FIGS. 3A and 3B, taken together, are top-view and side-view illustrations of readout transistor $T_2$ of FIGS. 1A, 1B, and 2, useful in understanding the present invention.
Figure 3B:
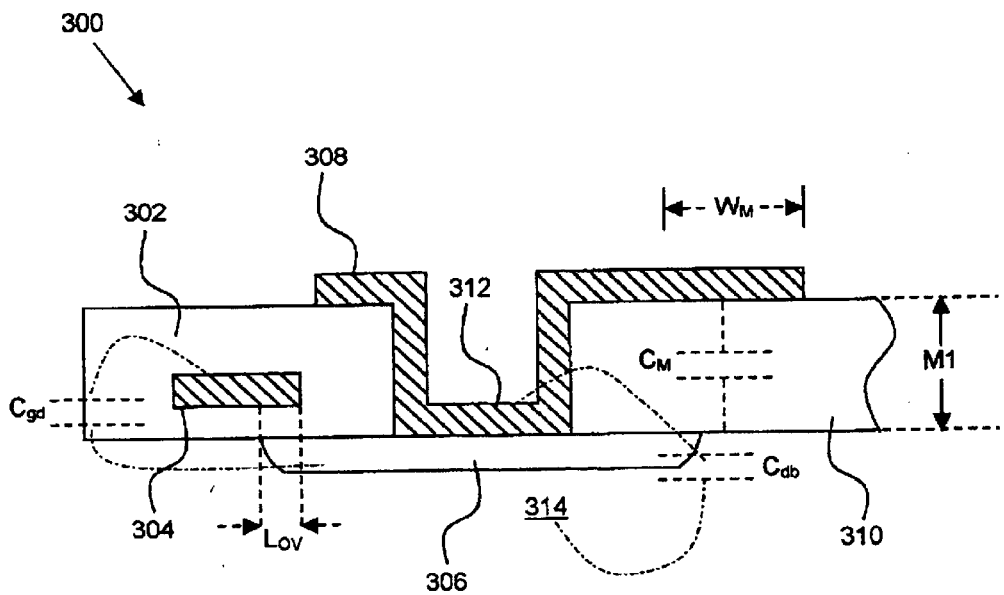

Reference is now made to FIGS. 3A and 3B, which are top-view and side-view illustrations of readout transistor $T_2$ of FIGS. 1A, 1B, and 2, useful in understanding the present invention. In FIGS. 3A and 3B a transistor assembly 300 is shown including a transistor $T_2$ element 302 including a gate 304, a drain 306, a column metal line 308, a field oxide element 310, a connection 312 of column metal line 308 to drain 306, all overlying a bulk 314.

In FIGS. 3A and 3B, transistor $T_2$ is shown with its contact and an adjacent section of column line, typically constructed from M1 metal. It may be seen that the width of transistor $T_2$ transistor is not minimal due to the drain-to-column contact rules which require the width of transistor $T_2$ to be more than double the minimal possible transistor channel width. The drain diffusion capacitance and the overlapping gate-drain capacitance determine the drain capacitance $C_d$ as follows:

$$C_d \cong C_{gd} + C_{db} \quad \text{(EQ. 9)}$$

where $C_{gd}$ is the gate-to-drain overlapping capacitance, and $C_{db}$ is the drain bulk diode capacitance at zero volts. It may further be seen that:

$$C_{gd} \cong W \cdot L_{OV} \cdot c_g \quad \text{(EQ. 10)}$$

where W is the $T_2$ transistor's width, $L_{OV}$ is the overlapping distance between the gate and the drain, which is usually derived in an empirical manner, and $C_g$ is the gate-bulk capacitance per unit area determined by the gate oxide thickness. And finally:

$$C_{db} \cong c_{jd}^0 \cdot A_d + c_{jdsw}^0 \cdot P_d \quad \text{(EQ. 11)}$$

where $c_{jd}^0$ is the drain junction capacitance at zero voltage bias per area unit, $A_d$ is the drain junction area, $c_{jdsw}^0$ is the drain junction sidewall capacitance per unit length at zero voltage bias, and, $P_d$ is the junction periphery length which includes all the junction sidewalls excluding the gate side.

By way of example, for a typical 0.6 $\mu$m CMOS process, the $T_2$ transistor has $A_d \cong 2$ $\mu m^2$ $P_d \cong 4$ vm $c_{jd}^0 \cong 0.4$ $fF/\mu m^2$ $c_{jdsw}^0 \cong 0.45$ $fF/\mu m$ $L_{OV} \cong 0.1$ $\mu$m Therefore, $C_d$ may be expressed as:

$$C_d \cong 3 \, fF \quad \text{(EQ. 12)}$$

The metal capacitance per unit length $C_M$ is given by:

$$c_M = c_M^A \cdot W_M + 2 \cdot c_M^P \quad \text{(EQ. 13)}$$

where $c_M^A$ is the metal line capacitance per area unit, and $c_M^P$ is the metal capacitance, per line side, per unit length. Thus, for the example 0.6 μm CMOS process, the typical Metal 1 capacitances are $$c_M^A \cong 0.04 \ fF/\mu m^2$$
$$c_M^P \cong 0.03 \ fF/\mu m$$

and a metal width $W_M \cong 0.6 \ \mu m$,
giving a metal capacitance per unit length $C_M$ as $$c_M \cong 0.08 \ fF/\mu m \quad \text{(EQ. 14)}$$

Given EQ. 12 and 14, for a pixel pitch a=10 μm the total column capacitance per pixel $c_{col}$ may be calculated as:

$$c_{col} \cong 3.8 \ fF/pixel \quad \text{(EQ. 15)}$$

Thus if V=1,000, the column capacitance is approximately 3.8 pF.

The integration capacitor's capacitance value may also be calculated. This value for a 0.6 μm CMOS process is:

$$C_{int} \cong 0.1 \ pF \quad \text{(EQ. 16)}$$

Figure 4:
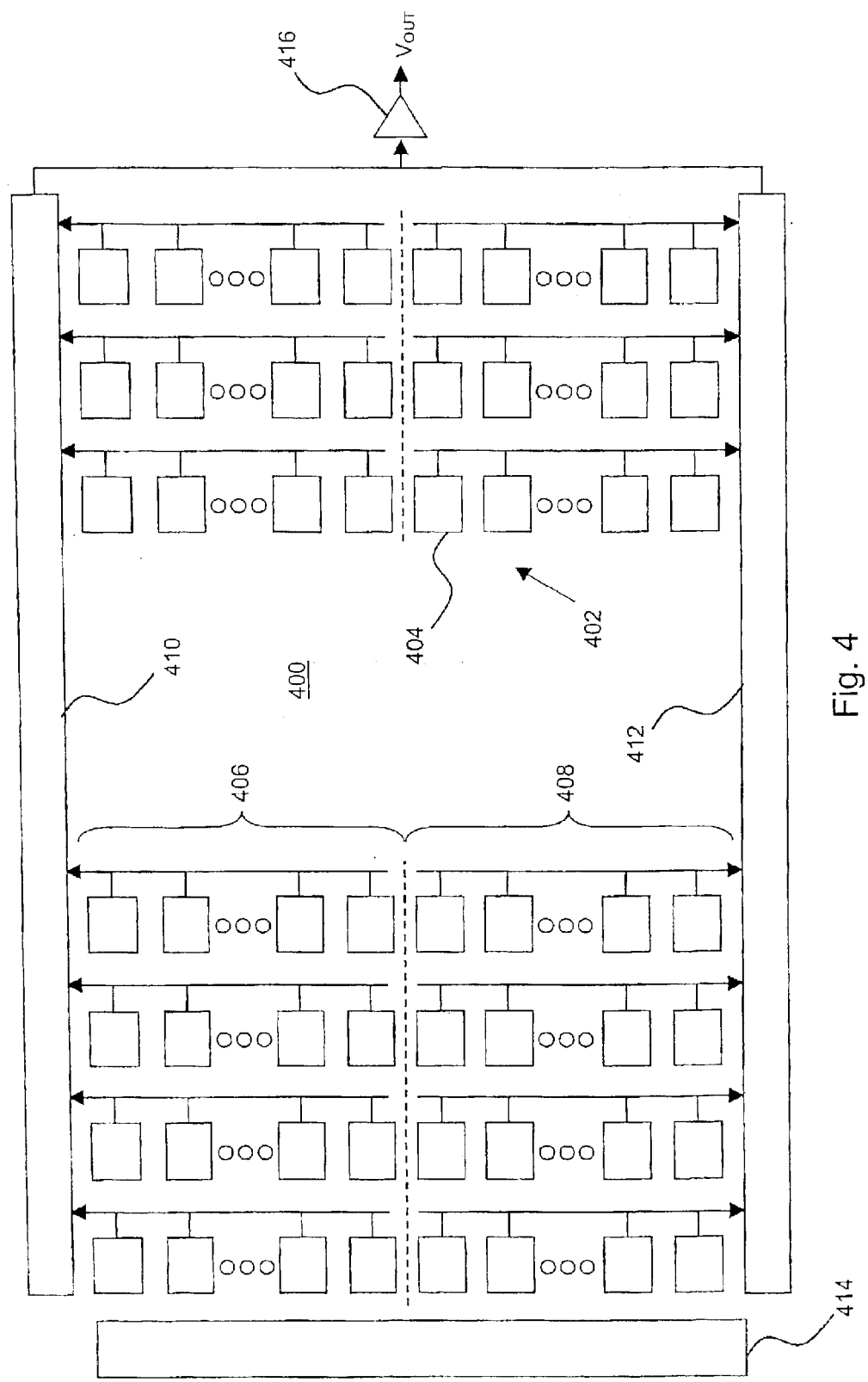
FIG. 4 is a schematic illustration of an image sensor array, constructed and operative in accordance with a preferred embodiment of the present invention.

Reference is now made to FIG. 4, which is a schematic illustration of an image sensor array 400, constructed and operative in accordance with a preferred embodiment of the present invention. The sensor array 400 of FIG. 4 includes one or more columns 402, each having one or more Direct Injection (DI) unit cells 404 configured as described hereinabove with reference to FIGS. 1A, 1B, 2, 3A, and 3B. As in most any two-dimensional array, sensor array 400 may be alternatively referred to as having one or more rows of unit cells 404. Each column 402 of sensor array 400 is separated into two or more electrically isolated portions, such as into an upper half 406 and a lower half 408 as shown in FIG. 4, thus forming one or more upper half rows and one or more lower half rows. The separation of the portions of each column is such that there is little or no conductivity between the portions, such as a resistance of greater that 10 M Ohm. Each electrically isolated portion is arranged to be read out through a separate sense amplifier, such as is shown in FIG. 4 where each upper half row is arranged to be read out through a top sense amplifier set 410, and each lower half row is arranged to be read out through a bottom sense amplifier set 412. Sensor array 400 is also preferably configured with a row decoder 414 and an output buffer 416.

Since the upper and lower halves 406 and 408 of each column 402 are electrically isolated, the column capacitance which each sense amplifier set faces may be expressed as:

$$C_{col}^1 = \frac{V}{2} \cdot c_{col} \quad \text{(EQ. 17)}$$

The associated noise floor is of each sense amplifier set is thus, $$\langle v_n^1 \rangle = \sqrt{\frac{kT}{C_{int}}} \cdot \left( \sqrt{\frac{0.5 \cdot C_{col}}{C_{int}}} + \sqrt{\frac{C_{int}}{0.5 \cdot C_{col}}} \right) \quad \text{(EQ. 18)}$$

where typically $C_{col} \gg C_{int}$. The reduction in the noise level may then be calculated as:

$$\frac{\langle v_n^1 \rangle}{\langle v_n \rangle} \cong 0.707 \quad \text{(EQ. 19)}$$

Thus, by splitting each column in the array into two halves, the noise floor is reduced to about 70% of what it would be were the columns not split.

The signal-to-noise ratio of the output data improves by the same factor as the noise floor reduction as follows:

$$\frac{SNR^1}{SNR} \cong \sqrt{2} \quad \text{(EQ. 20)}$$

where $SNR^1$ is the signal-to-noise ratio of the split array, and SNR is the signal-to-noise ratio an undivided array as described hereinabove with reference to FIGS. 1A, 1B, 2, 3A, and 3B. In an array where the columns are split into N portions, the improvement of the SNR will be on the order of the square root of N.

Figure 5:
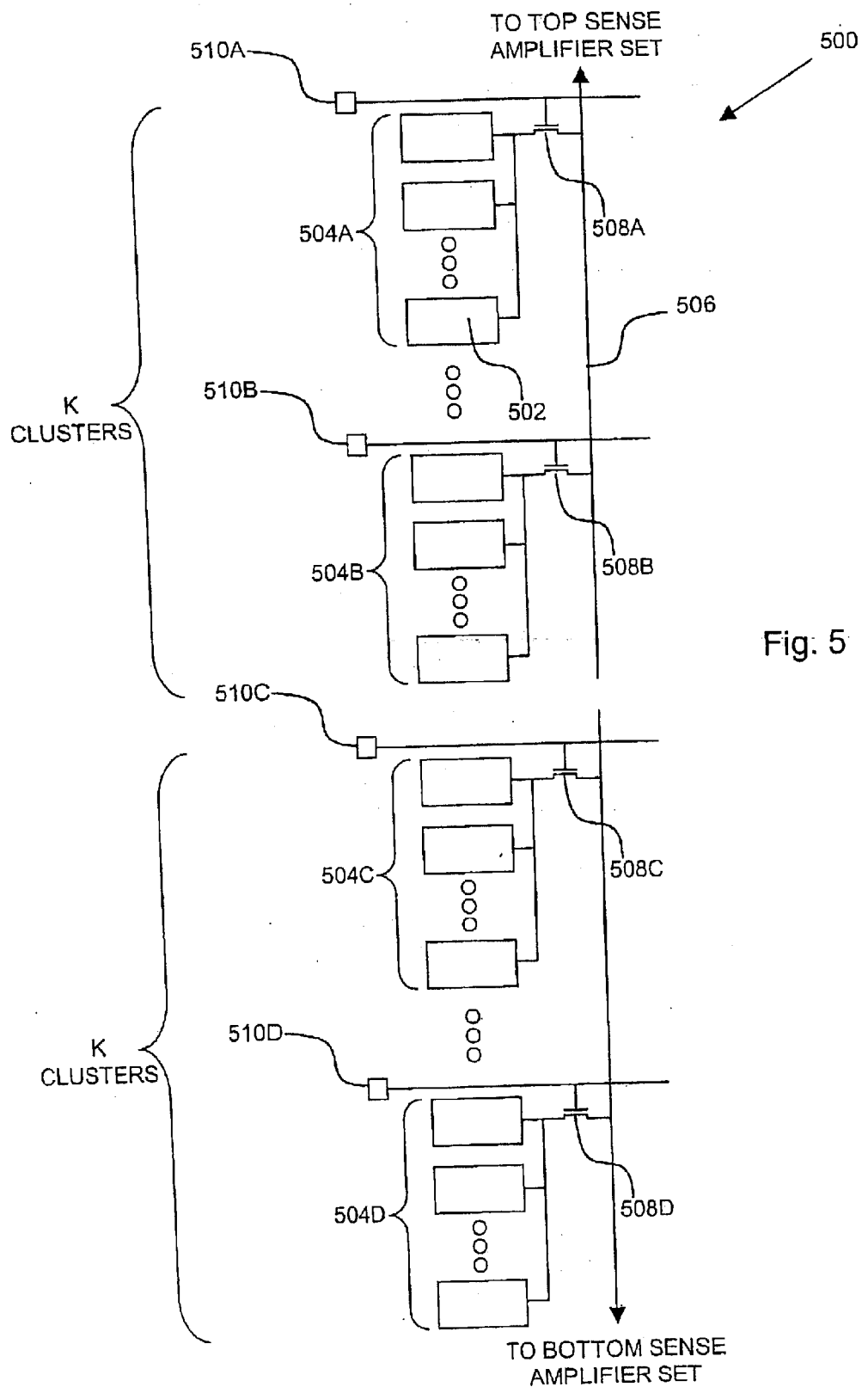
FIG. 5 is a schematic illustration of an alternative image sensor array column arrangement for use with the image sensor array of FIG. 4, constructed and operative in accordance with a preferred embodiment of the present invention.

Reference is now made to FIG. 5, which is a schematic illustration of an alternative image sensor array column arrangement for use with the image sensor array of FIG. 4, constructed and operative in accordance with a preferred embodiment of the present invention. The sensor array column of FIG. 5, now referred to as column 500, includes one or more Direct Injection (DI) unit cells 502 configured as described hereinabove with reference to FIGS. 1A, 1B, 2, 3A, and 3B, and is separated into electrically isolated upper and lower halves as is described hereinabove with reference to FIG. 4. Each half of column 500 is segmented into k clusters 504 (shown as 504A, 504B, 504C, and 504D), typically numbering two or more. Each cluster 504 may be expressed as including $$\frac{V}{2k}$$

unit cells, where V is the number of image sensor rows, and is interconnected to a column line 506 via a cluster select transistor 508 (shown as 508A, 508B, 508C, and 508D) that is controlled by a cluster selector 510 (shown as 510A, 510B, 510C, and 510D).

Typically, during row readout of column 500, only one out of 2·k cluster select transistors 508 in column 500 is "ON", and all other cluster select transistors 508 in column 500 are "OFF". The row readout typically starts with the top cluster 504A, when cluster select transistors 508A transistor is "ON". The first cluster rows are then selected and sequentially read, starting with row 0, and ending with row $$\frac{V}{2 \cdot k} - 1.$$

After all the rows in the top cluster are read out, cluster select transistor 508A of the top cluster 504A switches from "ON" to "OFF" (i.e., cluster selector 510A goes from "High" to "Low"), and cluster select transistor 508B of the next cluster 504B switches from "OFF" to "ON" ((i.e., cluster selector 510B goes from "Low" to "High"). The rows of cluster 504B are then read sequentially. This operation continues until all the rows of the all of the columns 500 of the image sensor array are read out. As is described hereinabove with reference to FIG. 4, the top half rows of each column 500 is read through a top sense amplifier set, while the bottom half rows of each column 500 is read through a bottom sense amplifier set.

It may be seen that since only one cluster 504 is actively connected to column line 506 at a time while all the other clusters are not actively connected to column line 506, the total parasitic load of column line 506 is significantly reduced. By way of explanation, assume that cluster select transistors 508 are of the same dimensions as the readout transistors $T_2$ (FIGS. 1A, 1B, 2, 3A, and 3B) in every unit cell. This assumption may be justified, since the transistor's width is much wider the minimum width, where the width is determined by metal-to-drain contact dimensions and overlap design rules. Thus, putting such two transistors in series does not significantly slow down the readout. Therefore, the dimensions of cluster select transistor 508 may be given the same dimensions as that of readout transistor $T_2$. This being the case, the drain capacitance of cluster select transistor 508 is identical to that of readout transistor $T_2$. Since k–1 cluster select transistors 508 are "OFF" at any given time, their associated clusters are not actively connected to column line 506 and, therefore, do not load the column line.

The capacitance of column line 506 may be calculated as:

$$C_{col}^2 \cong \frac{V}{2 \cdot k} \cdot (C_d + c_M \cdot a) + \left(k \cdot C_d + \frac{V}{2} \cdot c_M \cdot a\right) \quad \text{(EQ. 21)}$$

where $$\frac{V}{2 \cdot k} \cdot \left(C_d + \frac{V}{2} \cdot c_M \cdot a\right)$$

is the capacitance associated with a single currently-read cluster, $$\left(k \cdot C_d + \frac{V}{2} \cdot c_M \cdot a\right)$$

approximates the capacitance associated with the column and the cluster select transistors parasitic capacitance.

Since it is highly desirable to minimize column capacitance, the optimal value for k may be found for EQ. 21 as:

$$k_{opt} \cong \sqrt{0.5 \cdot V \cdot \left(1 + \frac{c_M \cdot a}{C_d}\right)} \quad \text{(EQ. 22)}$$

Once the optimal number of rows in a cluster is determined, the column capacitance may be also derived from EQ. 21.

Continuing with the example presented hereinabove, for an image sensor with 1,000 rows, on a 0.6 $\mu$m CMOS process, $k_{opt} \cong 25$. Thus, in this example, each half of the image sensor array should be divided into 25 clusters, with 20 rows in each, in order to achieve a minimum column capacitance of $C_{col}^2 \cong 0.55$ pF.

Thus, through column segmentation and image sensor array halving, column capacitance may be reduced approximately by a factor of 7. This reduces the noise floor from about 1.5 mVolts to less than 0.7 mVolts in the present example, and improves the signal-to-noise ratio from approximately 1,000, to approximately 2300.

It is appreciated that several options are available by which the necessary circuitry described hereinabove may be implemented in a minimum of space. For example, the cluster line may be implemented in M1, while the column line may be implemented over the cluster line in M2. Alternatively, the cluster line may be implemented in Poly, while the column line is implemented over the cluster line in M1. The cluster selector lines may also be implemented in Poly. This is feasible since the cluster selection is done infrequently, once every $$\frac{V}{2 \cdot k}$$

rows. Thus, the longer time it takes to precondition the cluster for readout is insignificant. It is also possible to alternate the readout between rows in the upper half of the image sensor array and rows in the bottom half. This would effectively double the readout time per row, and leave significant slack time for cluster switching. If the cluster select line is implemented in Poly, it could be placed over a ground line or a signal line which runs in metal, thus reducing space requirements even further.

It is appreciated that one or more of the steps of any of the methods described herein may be omitted or carried out in a different order than that shown, without departing from the true spirit and scope of the invention.

While the methods and apparatus disclosed herein may or may not have been described with reference to specific hardware or software, it is appreciated that the methods and apparatus described herein may be readily implemented in hardware or software using conventional techniques.

While the present invention has been described with reference to one or more specific embodiments, the description is intended to be illustrative of the invention as a whole and is not to be construed as limiting the invention to the embodiments shown. It is appreciated that various modifications may occur to those skilled in the art that, while not specifically shown herein, are nevertheless within the true spirit and scope of the invention.

What is claimed is:

1. A split column in an imaging sensor array, said split column comprises:
    a first plurality of unit cells arranged in a first half-column, each unit cell of said first plurality of unit cells is controllably electrically couplable through a first half-column line to a first sense amplifier; and
    a second plurality of unit cells arranged in a second half-column, each unit cells of said second plurality of unit cells is controllably electrically couplable through a second half-column line to a second sense amplifier,
    wherein the number of unit cells in said first half-column is equal to the number of unit cells in said second half-column, and wherein said first half-column line is substantially electrically isolated from said second half-column line,
    wherein the column capacitance of each half-column of said first half-column and said second half-column is significantly reduced as compared to the column capacitance of a non-split column.

2. The split column according to claim 1 wherein said imaging sensor array comprises a plurality of rows of unit cells and wherein each unit cell of said first plurality of unit cells and of said second plurality of unit cells belongs to a different row of said plurality of rows.

3. The split column according to claim 1 wherein said unit cells are direct injection unit cells.

4. The split column according to claim 1 wherein unit cells within the split column are arranged in a plurality of 2K unit cell clusters, wherein each half-column of said first half-column and said second half-column includes K clusters, each cluster of the K clusters of said first half-column comprises N unit cells and a cluster selecting device operatively connected to each of said N unit cells, wherein for each cluster in said first half-column each of the unit cells of the cluster are controllably electrically connectable to said first half-column line through the cluster selecting device, and each cluster of the K clusters of said second half-column comprises N unit cells and a cluster selecting device operatively connected to each of said N unit cells, wherein for each cluster in said second half-column each of the unit cells of the cluster are controllably electrically connectable to said second half-column line through the cluster selecting device, wherein N is an integer number equal to or larger than two.

5. The split column according to claim 4 wherein for said first half-column, only one cluster out of the K clusters included in said first half-column is actively electrically connected to said first half-column line at any given time, and wherein for said second half-column, only one cluster out of the K clusters included in said second half-column is actively electrically connected to said second half-column line at any given time.

6. The split column according to claim 4 wherein the cluster selecting device of each of said 2K clusters comprises a cluster selecting transistor, and wherein for each half-column of said first half-column and said second half-column only one cluster selecting transistor is switched on at any given time, while the remaining K-1 cluster selecting transistors of the half-column are switched off, effectively reducing the capacitance of the half-column.

7. The split column according to claim 1 wherein said first half-column line and said second half-column line are substantially electrically isolated from each other by at least 10 Mohms.

8. An image sensor array comprising a plurality of split columns and a plurality of rows, each split column of said plurality of split columns comprises:

a first plurality of unit cells arranged in a first half-column, each unit cell of said first plurality of unit cells is controllably electrically couplable through a first half-column line to a first sense amplifier; and a second plurality of unit cells arranged in a second half-column, each unit cells of said second plurality of unit cells is controllably electrically couplable through a second half-column line to a second sense amplifier, wherein the number of unit cells in said first half-column is equal to the number of unit cells in said second half-column, and wherein said first half-column line is substantially electrically isolated from said second half-column line, wherein the column capacitance of each half-column of said first half-column and said second half-column is significantly reduced as compared to the column capacitance of a non-split column.

9. The image sensor array according to claim 8 wherein said first half-column line and said second half-column line are substantially electrically isolated from each other by at least 10 Mohms.

10. The image sensor array according to claim 8 wherein each unit cell of said first plurality of unit cells and of said second plurality of unit cells belongs to a different row of said plurality of rows.

11. The image sensor array according to claim 8 wherein said unit cells are direct injection unit cells.

12. The image sensor array according to claim 8 wherein said unit cells within each split column of said plurality of split columns are arranged in a plurality of 2K unit cell clusters, wherein each half-column of said first half-column and said second half-column comprises K clusters, each cluster of the K clusters of said first half-column comprises N unit cells and a cluster selecting device operatively connected to each of said N unit cells, wherein for each cluster in said first half-column each of the N unit cells of the cluster are controllably electrically connectable to said first half-column line through the cluster selecting device, and each cluster of the K clusters of said second half-column comprises N unit cells and a cluster selecting device operatively connected to each of said N unit cells, wherein for each cluster in said second half-column each of the unit cells of the cluster are controllably electrically connectable to said second half-column line through the cluster selecting device, wherein N is an integer number equal to or larger than two.

13. The image sensor array according to claim 12 wherein for said first half-column, only one cluster out of the K clusters included in said first half-column is actively electrically connected to said first half-column line at any given time, and wherein for said second half-column, only one cluster out of the K clusters included in said second half-column is actively electrically connected to said second half-column line at any given time.

14. The image sensor array according to claim 13 wherein the cluster selecting device of each of said 2K clusters comprises a cluster selecting transistor, and wherein for each half-column of said first half-column and said second half-column only one cluster selecting transistor is switched on at any given time, while the remaining K-1 cluster selecting transistors of the half-column are switched off, effectively reducing the capacitance of the half-column.

15. An image sensor array comprising a plurality of unit cells arranged in a plurality of columns and a plurality of rows, each column of said plurality of columns comprises:

a column line for operatively coupling unit cells of the column to a sense amplifier;

a plurality of K clusters of said unit cells, each cluster of said clusters includes N unit cells, wherein N is an integer number equal to or greater than two, each unit cell of said N unit cells belongs to a different row of said plurality of rows;

a plurality of K cluster selecting devices, each cluster selecting device is coupled to said column line through a cluster line and is operatively connected to all N unit cells of a different single cluster of said K clusters, wherein each unit cell of the N unit cells within a cluster is configured to be electrically connected to said column line by activating the cluster selecting device associated with the cluster and by selecting the row to which the unit cell belongs, and wherein said array is configured to activate only one cluster selecting device of said plurality of K cluster selecting devices of a column at any given time, substantially reducing the column capacitance.

16. The image sensor array according to claim 15 wherein each cluster selecting device of said plurality of K cluster selecting devices comprises a cluster selecting transistor connected to all the N unit cells of a cluster and to said cluster line, each cluster selecting transistor may be switched on and off, and wherein for each column of said array only one cluster selecting transistor is switched on at any given time, while the remaining K-1 cluster selecting transistors of the column are switched off, substantially reducing the column capacitance.

17. The image sensor array according to claim 15 wherein said unit cells are direct injection unit cells, each unit cell includes a readout transistor, wherein said readout transistor is configured for actively electrically connecting the unit cell to said column line through said cluster selecting transistor.

18. A method for improving the signal to noise ratio in an imaging array comprising a plurality of unit cells arranged in columns and rows, without reducing image resolution, the method comprising:

configuring each of said columns into a first half-column comprising a first plurality of unit cells and a second half-column comprising a second plurality of unit cells, wherein the number of unit cells in said first half-column is equal to the number of unit cells in said second half-column;

providing for each column of said unit cells a first half-column line and a second half-column line, said first half-column line is substantially electrically isolated from said second half-column line, wherein each unit cell of said first plurality of unit cells is controllably electrically couplable through said first half-column line to a first sense amplifier, and wherein each unit cell of said second plurality of unit cells is controllably electrically couplable through said second half-column line to a second sense amplifier, wherein the capacitance of each of said first half-column and said second half-column is substantially reduced as compared to the column capacitance of a column including all the unit cells of said first and said second pluralities of cells coupled to a column line extending along the entire length of the column to improve the signal to noise ratio;

sensing the unit cells of said first half-column with said first sense amplifier; and sensing the unit cells of said second half-column with said second sense amplifier.

19. A method for improving the signal to noise ratio without reducing image resolution in an imaging array comprising a plurality of unit cells arranged in columns and rows, each column of said columns comprises a column line, the method comprising:

configuring the unit cells in each of said columns into K clusters of unit cells each cluster comprising N unit cells, each cluster comprises a cluster selecting device operatively connected to all N unit cells of the cluster, said cluster selecting device is controllably electrically connectable to a column line common to all the K clusters included in a column;

operating each column of said columns to sense the units cells of each column such that only one cluster of unit cells out of the K clusters included in the column is actively electrically connected to said column line at any given time, substantially reducing the column capacitance to improve the signal to noise ratio.

20. The method according to claim 19 wherein each cluster selecting device of a cluster of said K clusters comprises a cluster selecting transistor connected to all the N unit cells of the cluster and to said column line, each cluster selecting transistor is configured to be switched on and off, and wherein for each column of said array only one cluster selecting transistor is switched on at any given time to electrically connect the N unit cells of the cluster to said column line, while the remaining K-1 cluster selecting transistors of the column are switched off, substantially reducing the column capacitance.

21. The method according to claim 20 wherein the N unit cells of a cluster are separately and sequentially sensed within the time period in which the cluster selecting transistor of the cluster is switched on.

22. A method for operating an imaging array comprising a plurality of unit cells arranged in columns and rows, each column of said columns comprises a column line, the method comprising:

configuring the unit cells in each of said columns into K clusters of unit cells each cluster comprising N unit cells, each cluster comprises a cluster selecting device operatively connected to all N unit cells of the cluster, said cluster selecting device is controllably electrically connectable to a column line common to all the K clusters included in a column;

operating each column of said columns to sense the units cells of each column such that only one cluster of unit cells out of the K clusters included in the column is actively electrically connected to said column line at any given time, substantially reducing the column capacitance.

23. The method according to claim 22 wherein each cluster selecting device of a cluster of said K clusters comprises a cluster selecting transistor connected to all the N unit cells of the cluster and to said column line, each cluster selecting transistor is configured to be switched on and off, and wherein for each column of said array only one cluster selecting transistor is switched on at any given time to electrically connect the N unit cells of the cluster to said column line, while the remaining K-1 cluster selecting transistors of the column are switched off, substantially reducing the column capacitance.

24. The method according to claim 23 wherein the N unit cells of a cluster are separately and sequentially sensed within the time period in which the cluster selecting transistor of the cluster is switched on.

* * * * *